United States Patent [19]

Laws

[11] Patent Number: 4,806,880
[45] Date of Patent: Feb. 21, 1989

[54] HIGH SPEED INTEGRATOR FOR DATA RECOVERY AND A COSTAS PHASE-LOCKED-LOOP CIRCUIT INCORPORATING SAME

[75] Inventor: Peter G. Laws, Swindon, England

[73] Assignee: Plessey Overseas Limited, Ilford, England

[21] Appl. No.: 19,901

[22] Filed: Feb. 27, 1987

[30] Foreign Application Priority Data

Feb. 28, 1986 [GB] United Kingdom ............... 8605002

[51] Int. Cl.$^4$ ..................... H03L 7/00; G06G 7/18
[52] U.S. Cl. .......................................... 331/8; 331/17; 328/127
[58] Field of Search ............... 331/8, 17, 25; 328/127, 328/151, 162; 375/58, 99, 103; 455/295, 296; 329/122

[56] References Cited

U.S. PATENT DOCUMENTS

| | | | |
|---|---|---|---|
| 3,839,679 | 10/1974 | Hughes | 328/127 |
| 3,906,214 | 9/1975 | Hess | 235/183 |
| 3,973,212 | 8/1976 | Walloch | 328/127 X |
| 4,361,811 | 11/1982 | Ormond | 328/127 |

FOREIGN PATENT DOCUMENTS 1026545  4/1966  United Kingdom .

*Primary Examiner*—Eugene R. LaRoche
*Assistant Examiner*—Robert J. Pasca
*Attorney, Agent, or Firm*—Fleit, Jacobson, Cohn & Price

[57] ABSTRACT

A circuit comprising three stages, a differential input stage, a store and integrate stage, and a differential output stage. Both input and output stages are co-operative with enable/disable switching, which switching is controlled by timing signals provided externally to control the periods of integration and data reading. The store and integrate stage comprises a pair of transistors and individual current sources, charge being integrated by a capacitor connected between the transistors. At the end of each period of integration the capacitor may be discharged via these sources, or, parallel sources and a further switch may be added to allow separate reset and hole period provision. Such circuits may be combined and timed out in phased sequence for fastest operation. They may be incorporated in Costas phase-locked loops and used as a means of communication data recovery.

10 Claims, 5 Drawing Sheets

4,806,880

HIGH SPEED INTEGRATOR FOR DATA RECOVERY AND A COSTAS PHASE-LOCKED-LOOP CIRCUIT INCORPORATING SAME

BACKGROUND OF THE INVENTION

The present invention relates to integrate circuits and more particularly to but not exclusively integrate and hold circuits which are capable of being produced usig integrated circuit technology.

An integrate and hold circuit is used to determine the average of an input signal over a set period of time ad the resultant condition is held while the subsequent circuitry acts on the result. This function is of particular use in the reconstruction of signals which have been distorted by noise and also in determining the duty cycle of a digital waveform.

SUMMARY OF THE INVENTION

It is an object of the present invention to provide an integrate circuit which is capable of being made in integrated circuit form and which is capable of high speed operation.

According to the present invention there is provided an integrate circuit comprising a first stage, namely a differential transistor input stage, which stage has complimentary outputs and includes a first switch means to enable and disable the same to set a period of time during which integration shall be performed;

a second state, namely a signal store and integrate stage, which second stage includes:

a pair of like transistors, these being arranged in parallel, the control electrodes of which transistors are connected to respective complimentary outputs of said first stage a pair of current sources connected respectively to said transistors; and, a capacitor, connected between said pair of transistors, across said pair of current sources; and, a third stage, namely a differential transistor output stage, the inputs to which third stage are connected to each side respectively of said capacitor, which third stage includes a third switch means to enable and disable the same to set a consecutive period of time during which the voltage across said capacitor is read and an output signal produced in response thereto.

Given the application of appropriate timing signals to the first and third switch means, periods of integration and voltage reading can be controlled.

The capacitor voltage may be read immediately following a period of integration. Reading then may take place at the onset of reset, the capacitor being reset by the pair of sources.

Alternatively, the circuit may be modified so that the capacitor charge may be held for a period of time prior to reset before the next integration period. Thus a second switch means may be interposed between the current sources and the transistors. The first and second switch means may be ganged together to operate simultaneously. The reset function may in this case be provided by further parallel current sources and a fourth switch means.

It is a feature of this invention, as above defined, that the capacitor may be reset rapidly and in a controlled linear manner, leaving no residual charge that would otherwise corrupt consecutive readings.

It is a further feature of this invention that the integration period may be dictated by choice of a suitable external clock signal applied to control the switch timing.

By the further provision of a rectifier and signal modulation means, the source currents may be modulated and in this way analogue signals processed.

To facilitate rapid sampling, a number of circuits as above, may be provided and the switch timing chosen so that the integrate and read functions of each circuit can be performed in a phased sequence.

Circuits of the kind above defined may be combined and utilized in Costas phase-locked-loop circuits, particular details of which will follow hereinbelow.

Further advantages and objecs of this invention will become apparent from the description that follows.

BRIEF DESCRIPTION OF THE DRAWINGS

Embodiments of the present invention will now be described, by way of example with reference to the accompanying drawings in which.

DESCRIPTION OF THE PREFERRED EMBODIMENTS

Figure 1:
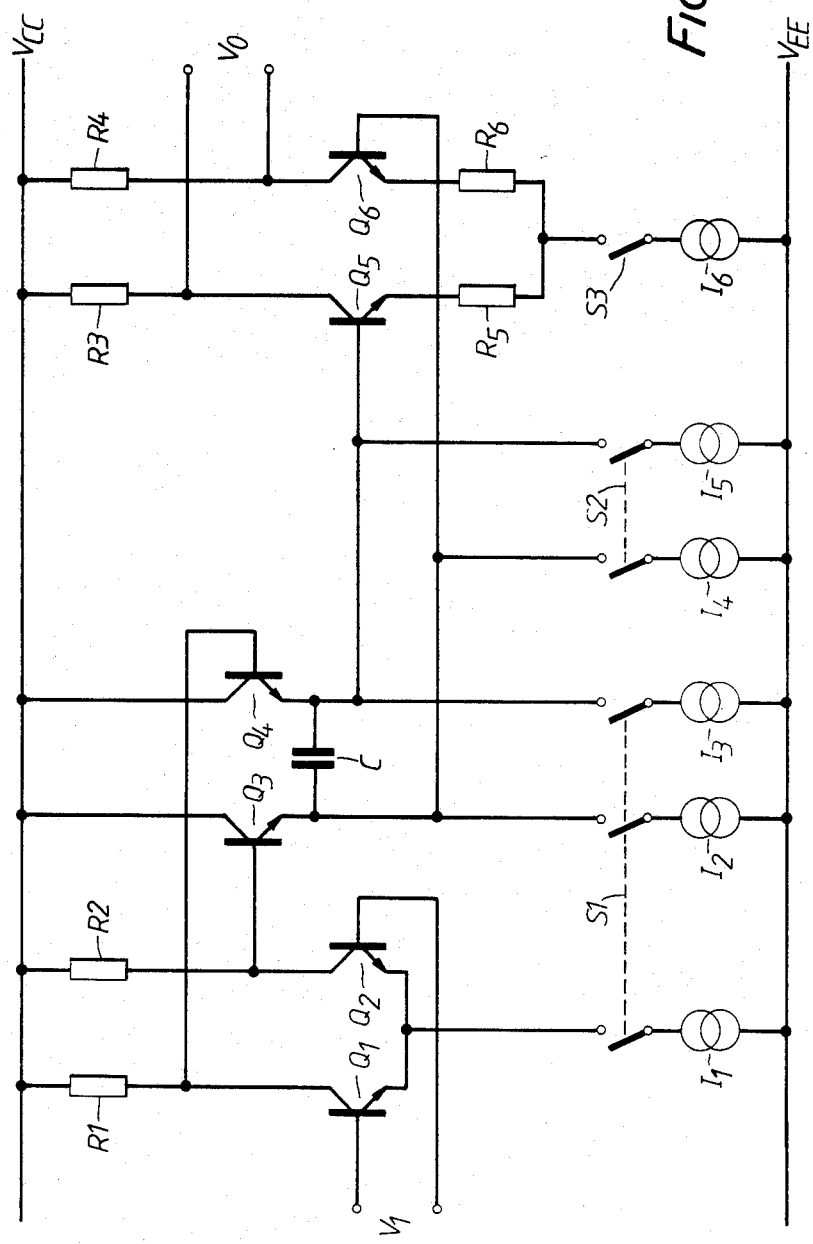
FIG. 1 shows in diagramatic form an integrate and hold circuit according to the present invention.
Figure 2:
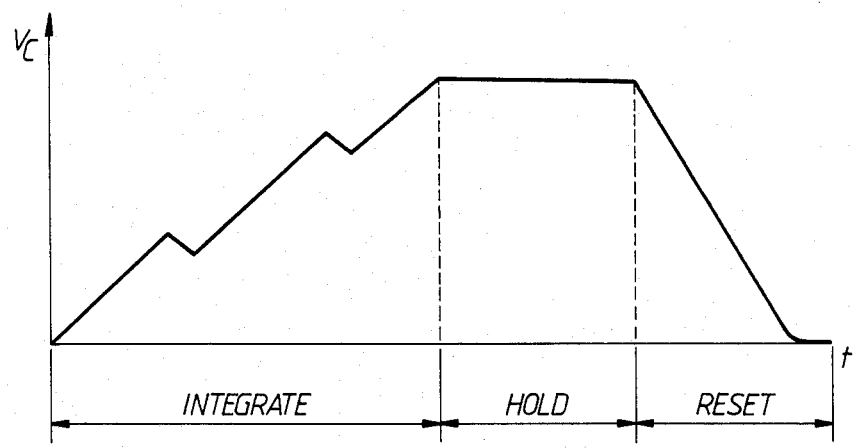
FIG. 2 shows a waveform diagram illustrating the operation of the circuit of FIG. 1.

With reference to FIGS. 1 and 2, the circuit functions in the following way:

A period of integration is determined by closing switch S1. During this period the phase of the input signal (V1) is determined by transistors Q1 and Q2, one of the bases of Q3 or Q4 will be held high the other low thus allowing the capacitor C to be charged at the rate dependant on current fed from sources I2 or I3. When the phase of V1 is changed the capacitor C is charged in the reverse direction, hence after a period of time involving a number of phase reversals, a net resultant charge will be present in capacitor C. This condition can be held by opening switch S1 which will disable any further charging of the capacitor C. The resultant condition can be read by closing switch S3, this normally coincides with the hold period and provides a differential analogue output voltage (Vo) dependent on the charge of the capacitor C. To maintain suitable bias conditions some level shifting may be required (see diodes in FIG. 3). The circuit is reset by closing switch block S2. In this state transistors Q3 and Q4 haveno differential voltage between the base drives and hence current sources I4 and I5 charge the capacitor C until both terminals are clamped by the emitters of transistors Q3 and Q4.

Figure 3:
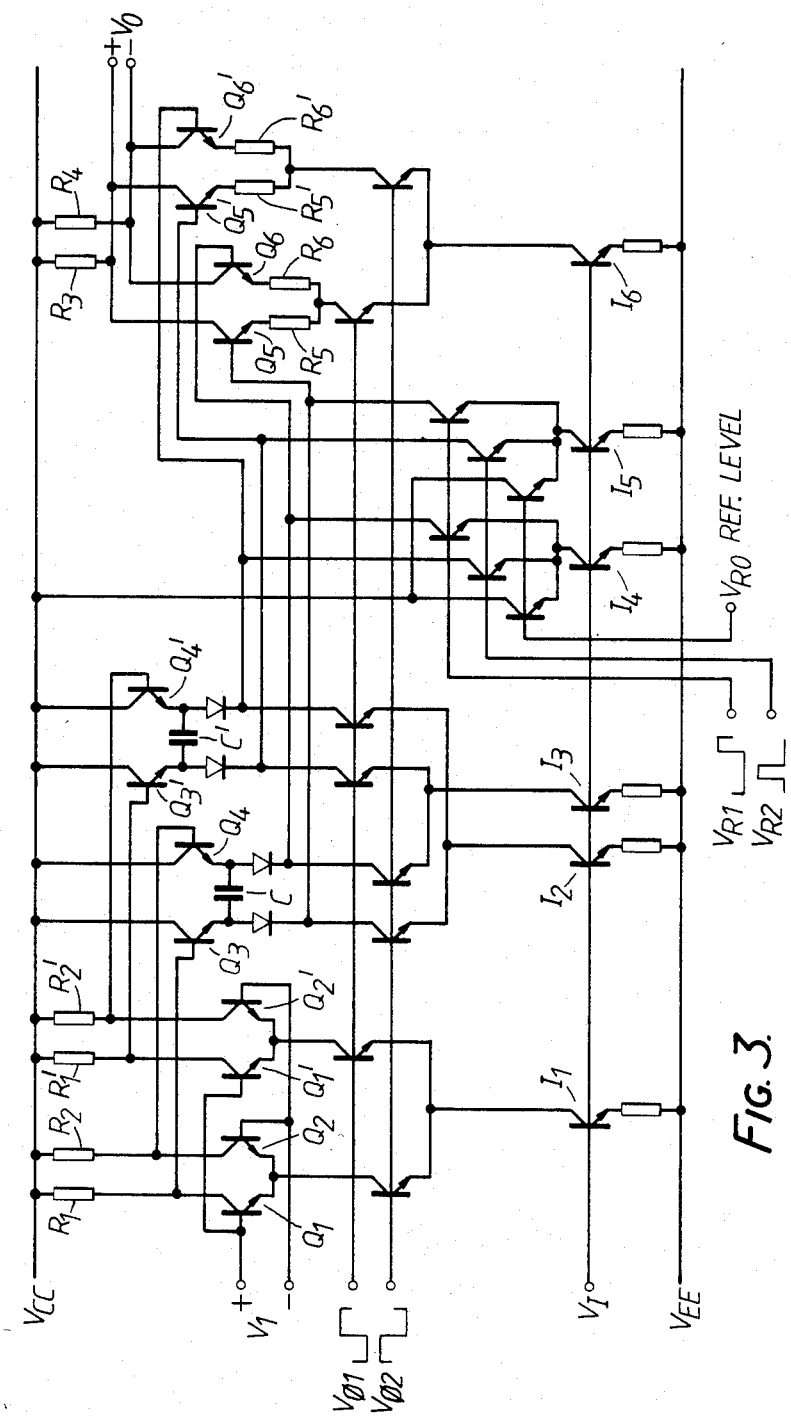
FIG. 3 shows a circuit diagram of a dual integrate ad hold circuit according to the present invention.

An input signal can be continuously monitored during successive time periods by using two (or more) circuits in parallel operating alternatively (or in sequence), this allows current sources to be switched between the circuits as shown in FIG. 3 by phased clocks Vφ1 and Vφ2. If the integral of an analog input signal is required this could be accomodated by modulating the current sources I2 and I3 by the amplitude of the input whilst maintaining a phase signal at V1. In some applications the hold period may not be required. In this case I2 and I3 may be switched on continuously i.e. wired in, and sources I4 and I5 omitted. The output in this case is read at the onset of the reset period and may be used for error correction in phase lock loops.

This circuit technique offers high speed operation which is suited to full integration in integrated circuits which have good transistors of only one type (e.g. NPN). The design is compatible with ECL circuits and offers benefits of differential operation resulting in no unidirectional error due to loading by the output stage.

Figure 4:
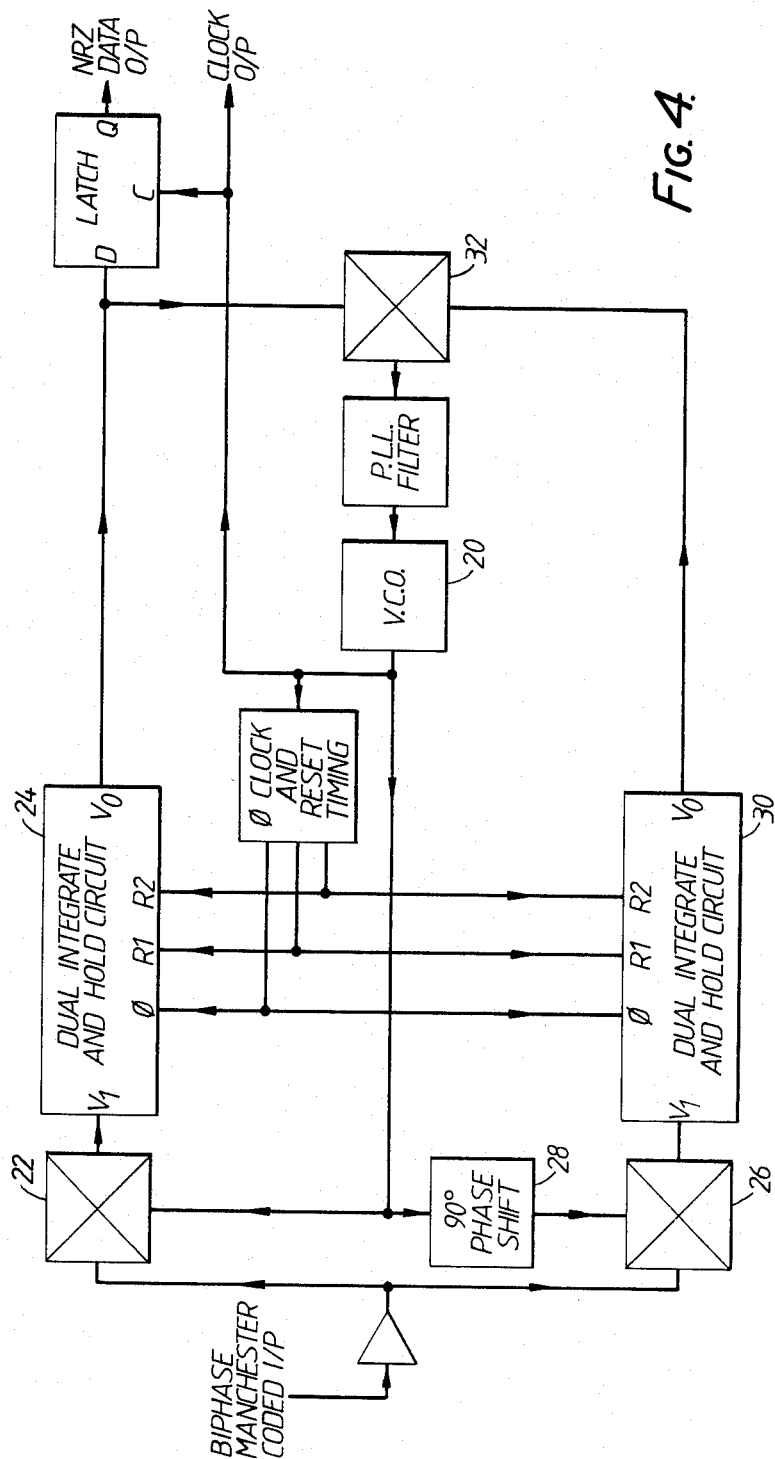
FIG. 4 shows a first application of the dual circuit of FIG. 3 in a COSTAS loop.

This system has been developed for use in Costas loops where advantage can be gained in signal response characteristics from use of true integration techniques. These systems normally utilize low pass filters which require additional pins on integrated circuits and have a degraded performance. An embodiment is shown in figure 4.

This circuit incorporates dual integrate and hold circuits of the kind shown in FIG. 3, and shows how data can be recovered directly from the top dual integrate and hold circuit when used for decoding a Manchester biphase input signal.

Figure 5:
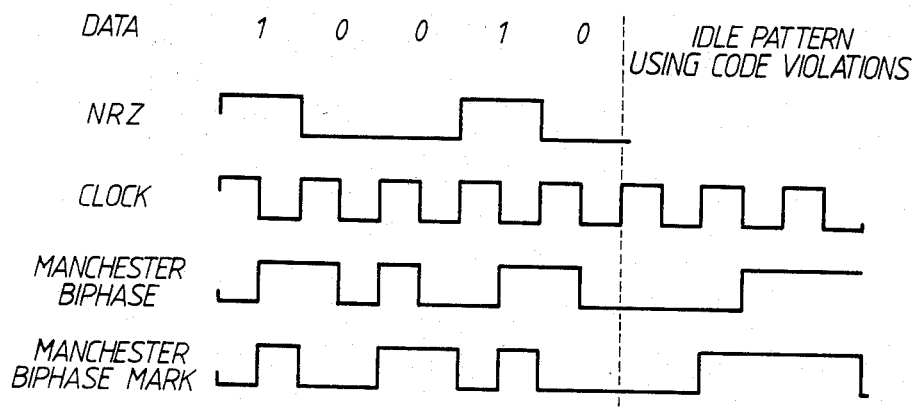
FIG. 5 shows waveform diagrams explaining the operation of the circuit of FIG. 4; and, FIG. 6 shows an application of the circuit of FIG. 1 used to integrate an analogue input signal.

The circuit operates in the following way:

First assume the clock output generated by the voltage controlled oscillator (VCO) 20 is coherent and in phase with the bit period as shown in FIG. 5. In this condition when the input signal is modulated in a mixer 22 by the clock signal and averaged by the integrator circuit 24 an output signal is generated which in this case is NZR data. In the lower branch the input signal is modulated in a mixer 26 by a quadrature (90°) phase shifted clock generated in circuit 28 which will average out to zero. If however there is a phase shift between the input signal and the VCO clock, then the quadrature modulated signal when integrated in circuit 30 over a bit period will produce an error signal which is polarity dependant on the data encoded. A corrected error signal can be generated by modulating the integrated signal by the data signal in mixer 32 hence providing a phase correction control signal for VCO 20.

The Costas loop technique may also be used for data and clock recovery in systems using other Manchester code formats (e.g. Manchester biphase mark). In these systems some extra logic circuitry is required to convert the data output from the Costas loop to corrected NRZ data.

Another benefit of this system is that code violation (used in idle codes for word synchronization, etc.) do not upset the system. This is because a constant input when modulated by a clock signal and averaged over one cycle produces a net zero error output and hence does not effect the VCO frequency.

The Costas loop may also be used for clock recovery in NRZ data systems (e.g. 4B5B codes etc). In this case the integrate and hold circuits may be simplified since no hold period would be required. An extra dual integrate and hold circuit could be used to recover the data.

Figure 6:
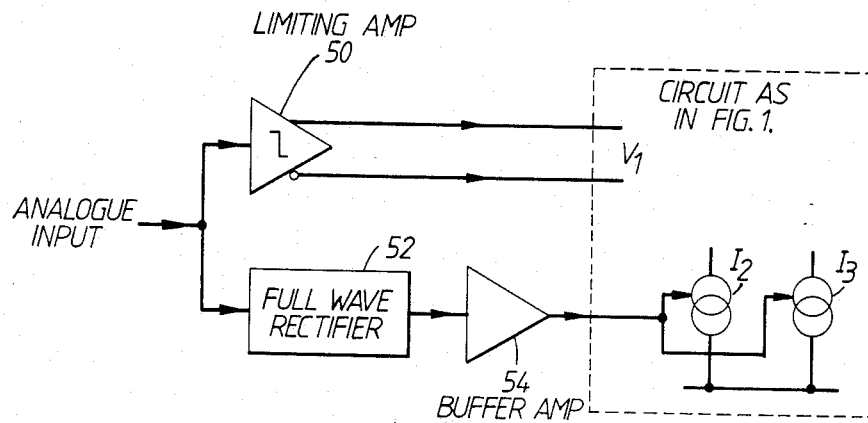

With reference to FIG. 6, an analog input signal may be integrated and held using the circuitry shown. The signal input is fed via a limiting amplifier 50 to form the input V1 to the circuit as shown in FIG. 1. The signal input is also fed via a full wave rectifier 52, the output of which is amplified in a buffer amplifier 54 the output of which is used to control the operation of current sources I2 and I3 and hence to control the rate of charging of the capacitor C. The output of the circuit Vo is therefore an integration of the analog inut signal over a required time period.

Having described the invention and the manner in which the same may be best performed, I claim:

1. An integrate circuit comprising:
    a first stage, a differential transistor input stage, which first stage has complementary outputs and includes a switch means to enable and disable the same to set a period of time during which integration shall be performed;
    a second stage, a signal store and integrate stage, which second stage includes:
    a pair of like transistors, these being arranged in parallel, the control electrodes of which transistors are connected to respective complementary outputs of said first-stage;
    a pair of current sources connected respectively to said transistors, and,
    a capacitor, connected between said pair of transistors, across said pair of current sources; and,
    a third stage, a differential transistor output stage, the inputs to which third stage are connected to each side respectively of said capacitor, which third stage includes a switch means to enable and disable the same to set a consecutive period of time during which the voltage across said capacitor is read and an output signal produced in response thereto.

2. An integrate circuit, as claimed in claim 1, wherein this circuit includes switch control means, co-operative with the switch means of both said first and second stages to determine successive periods of integration and reading of voltage across said capacitor respectively, it being arranged that said capacitor is reset by said pair of current sources whilst the first stage is disabled, and, said reading of voltage is performed at or near the onset of this reset.

3. An integrate circuit as claimed in claim 1, which circuit also includes:
    a switch means, part of said second stage, interposed between said pair of current sources and said transistors, and included below said capacitor, the switch means of said second stage being ganged to the switch means of said first stage to operate simultaneously therewith;
    a further pair of current sources parallel to the pair first mentioned, and provided to reset said capacitor; and,
    a further switch means, interposed between said further pair of current sources and said transistors, to set a period of time for resetting said capacitor.

4. An integrate circuit, as claimed in claim 3, wherein this circuit includes switch control means co-operative with the switch means of said first and second stages, the switch means of said third stage and said further switch means, to determine successive periods of integration and hold, and consecutive periods of reading of voltage across, and resetting, said capacitor respectively.

5. An integrate circuit, as claimed in claim 1, wherein all said transistors, said current sources and said switch means are implemented using npn type transistors, all incorporated in a common integrated circuit.

6. An integrate circuit, as claimed in claim 1, including:

current modulation means arranged to modulate the currents of said pair of current sources first mentioned; and, signal rectification means, co-operative with said modulation means arranged for receiving an input signal applied to said first stage.

7. A combination of plurality of like integrate circuits, each said integrate circuit comprising:

a first stage, a differential transistor input stage, which first stage has complementary outputs and includes a switch means to enable and disable the same to set a period of time during which integration shall be performed;

a second stage, a signal store and integrate stage, which second stage includes:

a pair of like transistors, these being arranged in parallel, the control electrodes of which transistors are connected to respective complementary outputs of said first-stage;

a pair of current sources connected respectively to said transistors, and, a capacitor, connected between said pair of transistors, across said pair of current sources; and, a third stage, a differential transistor output stage, the inputs to which third stage are connected to each side respectively of said capacitor, which third stage includes a switch means to enable and disable the same to set a consecutive period of time during which the voltage across said capacitor is read and an output signal produced in response thereto;

wherein coupling is provided at input of each said integrate circuit such that each shall receive input signal in parallel; together with:

switch control means, co-operative with all said switch means of said plurality of like integrate circuits, to operate said like integrate circuits in a phase sequential manner.

8. The combination, as claimed in claim 7, further comprising a common differential output load connected to the third stage of each said like integrate circuit.

9. A pair of like integrate circuits, first and second integrate circuits respectively, each of which circuits comprises:

a first stage, a differential transistor input stage, which first stage has a complementary outputs and includes a switch means to enable and disable the same to set a period of time during which integration shall be performed;

a second stage, a signal store and integrate stage, which second stage includes:

a pair of like transistors, these being arranged in parallel, the control electrodes of which transistors are connected to respective complementary outputs of said first-stage;

a pair of current sources connected respectively to said transistors, and, a capacitor, connected between said pair of transistors, across said pair of current sources; and, a third stage, a differential transistor output stage, the inputs to which third stage are connected to each side respectively of said capacitor, which third stage includes a switch means to enable and disable the same to set a consecutive period of time during which the voltage across said capacitor is read and an output signal produced in response thereto;

wherein the switch means of each first stage of said first and second integrate circuits are ganged to the switch means of the third stage of said second and first integrate circuits, respectively;

wherein said pair of current sources of each said first and second integrate circuits consist in a common pair of current sources; together with:

switch control means arranged to provide antiphase switch control signals to the switch means ganged as aforesaid; and, a common differential output load connected to the third stage of both of said pair of like integrate circuits.

10. A Costas phase-locked-loop circuit comprising:

first and second dual integrate circuits;

a first mixer connected to the outputs of said first and second dual integrate circuits;

a voltage controlled oscillator responsive to the output of said first mixer;

second and third mixers, responsive to a common input signal, referenced in quadrature to said oscillator; and connected each at output to the first and second dual circuits; and, phase clock and reset timing means, responsive to said oscillator, co-operative with each dual circuit and providing the switch control means therefor;

wherein each said first and second dual integrate circuit comprises: a pair of like integrate circuits, first and second integrate circuits respectively, each of which circuits comprises:

a first stage, a differential transistor input stage, which first stage has complementary outputs and includes a switch means to enable and disable the same to set a period of time during which integration shall be performed;

a second stage, a signal store and integrate stage, which second stage includes:

a pair of like transistors, these being arranged in parallel, the control electrodes of which transistors are connected to respective complementary outputs of said first-stage;

a pair of current sources connected respectively to said trasistors, and, a capacitor, connected between said pair of transistors, across said pair of current sources; and, a third stage, a differential transistor output stage, the inputs to which third stage are connected to each side respectively of said capacitor, which third stage includes a switch means to enable and disable the same to set a consecutive period of time during which the voltage across said capacitor is read and an output signal produced in response thereto;

wherein the switch means of each first stage of said first and second integrate circuits are ganged to the switch means of the third stage of said second and first integrate circuits, respectively;

wherein said pair of current sources of each said first and second integrate circuits consist in a common pair of current sources; together with:

switch control means arranged to provide antiphase switch control signals to the switch means ganged as aforesaid; and, a common differential output load connected to the third stage of both of said pair of like integrate circuits.

* * * * *